(12) United States Patent
Siepe

(10) Patent No.: US 7,597,235 B2
(45) Date of Patent: Oct. 6, 2009

(54) APPARATUS AND METHOD FOR PRODUCING A BONDING CONNECTION

(75) Inventor: Dirk Siepe, Warstein (DE)

(73) Assignee: Infineon Technologies AG, Neubiberg (DE)

( * ) Notice: Subject to any disclaimer, the term of this patent is extended or adjusted under 35 U.S.C. 154(b) by 78 days.

(21) Appl. No.: 11/940,523

(22) Filed: Nov. 15, 2007

(65) Prior Publication Data

US 2009/0127316 A1    May 21, 2009

(51) Int. Cl.
*B23K 1/06* (2006.01)
*B23K 31/02* (2006.01)

(52) U.S. Cl. .................. 228/110.1; 228/4.5; 228/180.5

(58) Field of Classification Search .................. None
See application file for complete search history.

(56) References Cited

U.S. PATENT DOCUMENTS

| | | | | |
|---|---|---|---|---|
| 4,030,657 A * | 6/1977 | Scheffer | ...................... | 228/1.1 |
| 4,619,397 A * | 10/1986 | Urban | ...................... | 228/111 |
| 4,765,526 A * | 8/1988 | Sato | ...................... | 228/4.5 |
| 4,976,392 A * | 12/1990 | Smith et al. | ...................... | 228/102 |
| 5,018,658 A * | 5/1991 | Farassat | ...................... | 228/4.5 |
| 5,190,206 A * | 3/1993 | Miller et al. | ...................... | 228/102 |
| 5,365,657 A * | 11/1994 | Brown et al. | ...................... | 29/850 |
| 5,452,838 A * | 9/1995 | Farassat | ...................... | 228/1.1 |
| 5,452,841 A * | 9/1995 | Sibata et al. | ...................... | 228/180.5 |
| 5,495,976 A * | 3/1996 | Mironesco et al. | ...................... | 228/110.1 |
| 5,564,616 A * | 10/1996 | Torihata et al. | ...................... | 228/4.5 |
| 5,906,706 A * | 5/1999 | Farassat | ...................... | 156/580.1 |
| 6,206,275 B1 * | 3/2001 | Biggs | ...................... | 228/180.5 |
| 6,439,448 B1 * | 8/2002 | Ringler | ...................... | 228/110.1 |
| 6,471,116 B2 * | 10/2002 | Copperthite | ...................... | 228/180.5 |
| 6,513,696 B1 * | 2/2003 | Ho et al. | ...................... | 228/4.5 |
| 6,667,625 B1 * | 12/2003 | Miller | ...................... | 324/525 |
| 6,827,248 B2 * | 12/2004 | Farassat | ...................... | 228/4.5 |
| 6,905,058 B2 * | 6/2005 | Farassat | ...................... | 228/1.1 |
| 7,216,794 B2 * | 5/2007 | Lange et al. | ...................... | 228/180.1 |
| 7,311,239 B2 * | 12/2007 | Laurent et al. | ...................... | 228/4.5 |
| 7,407,079 B2 * | 8/2008 | Copperthite et al. | ......... | 228/4.5 |
| 7,451,905 B2 * | 11/2008 | Bell | ...................... | 228/1.1 |
| 7,458,496 B2 * | 12/2008 | Farassat | ...................... | 228/4.5 |
| 7,461,768 B2 * | 12/2008 | Walther | ...................... | 228/1.1 |
| 2003/0192414 A1 * | 10/2003 | Farassat | ...................... | 83/694 |
| 2004/0011848 A1 * | 1/2004 | Farassat | ...................... | 228/1.1 |
| 2005/0150932 A1 * | 7/2005 | Hosseini | ...................... | 228/180.5 |
| 2005/0279811 A1 * | 12/2005 | Bell | ...................... | 228/180.5 |
| 2006/0071049 A1 * | 4/2006 | Farassat | ...................... | 228/4.5 |
| 2006/0157537 A1 * | 7/2006 | Walther | ...................... | 228/102 |
| 2006/0278682 A1 * | 12/2006 | Lange et al. | ...................... | 228/4.5 |
| 2009/0127317 A1 * | 5/2009 | Siepe et al. | ...................... | 228/110.1 |

* cited by examiner

*Primary Examiner*—Kiley Stoner
(74) *Attorney, Agent, or Firm*—Dicke, Billig & Czaja, P.L.L.C.

(57) ABSTRACT

One aspect relates to a bonding apparatus for producing a bonding connection between a bonding wire and a bonding partner. The bonding apparatus includes a heel shaper, which is provided for avoiding damage to the bonding wire in the heel region during the bonding operation.

One aspect relates to a method for producing a bonding connection by means of a bonding apparatus having a heel shaper and a bonding stamp. The heel shaper is situated relative to the bonding stamp in a first active position or can be moved into such a first active position. In the first active position, the heel shaper ensures that the bonding wire runs in a permissible region in the heel region.

12 Claims, 10 Drawing Sheets

FIG 3
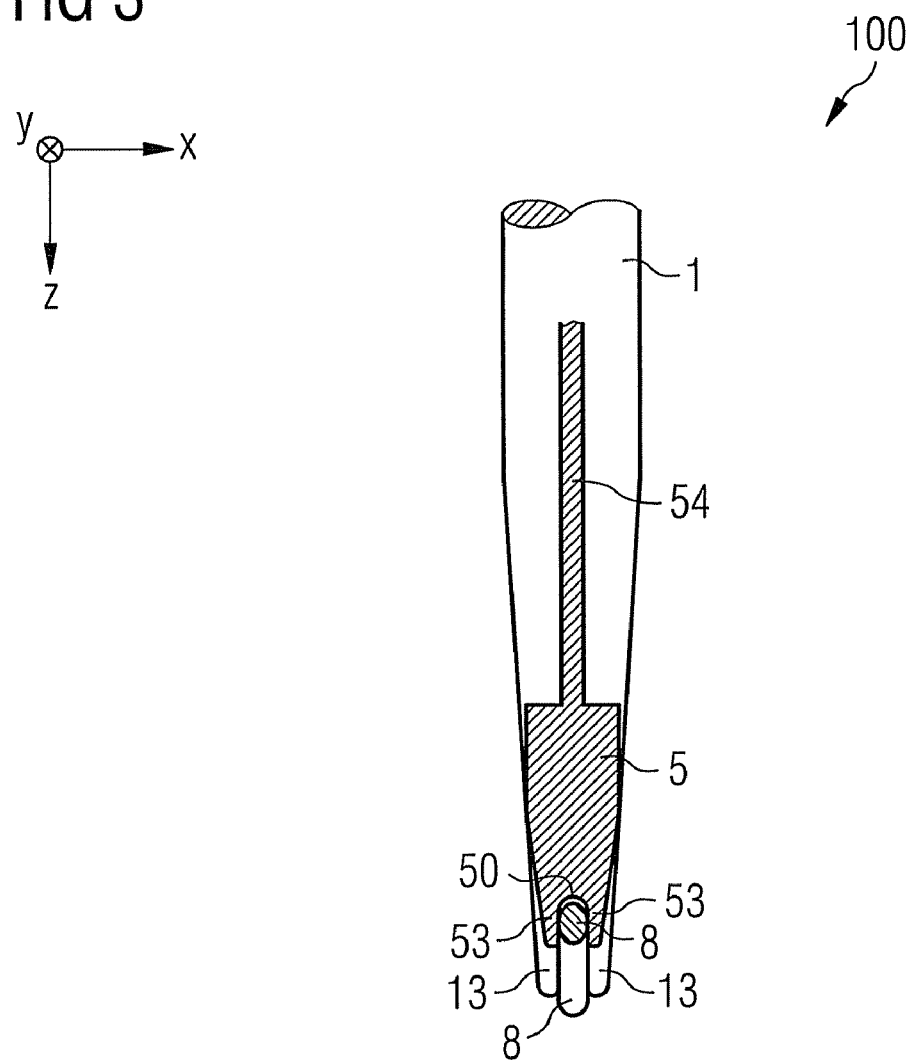
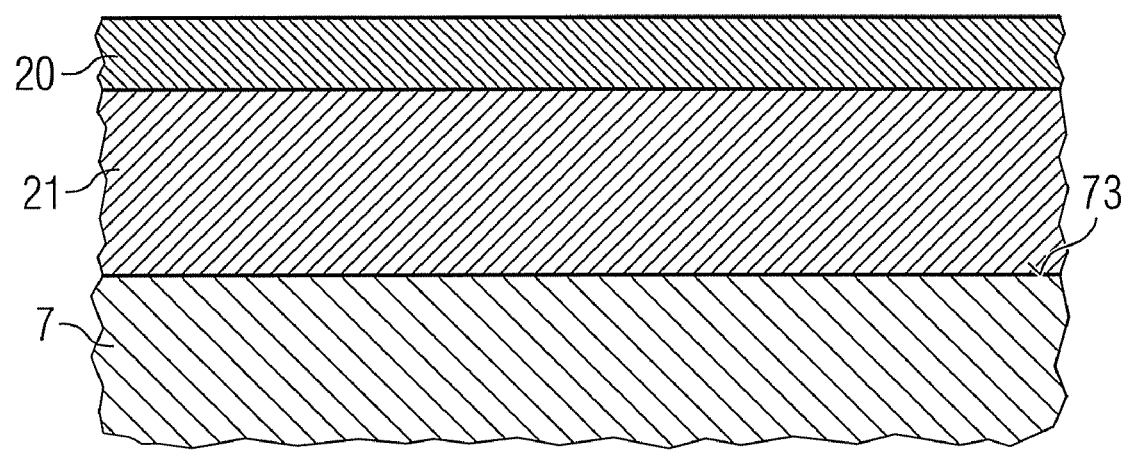

FIG 4
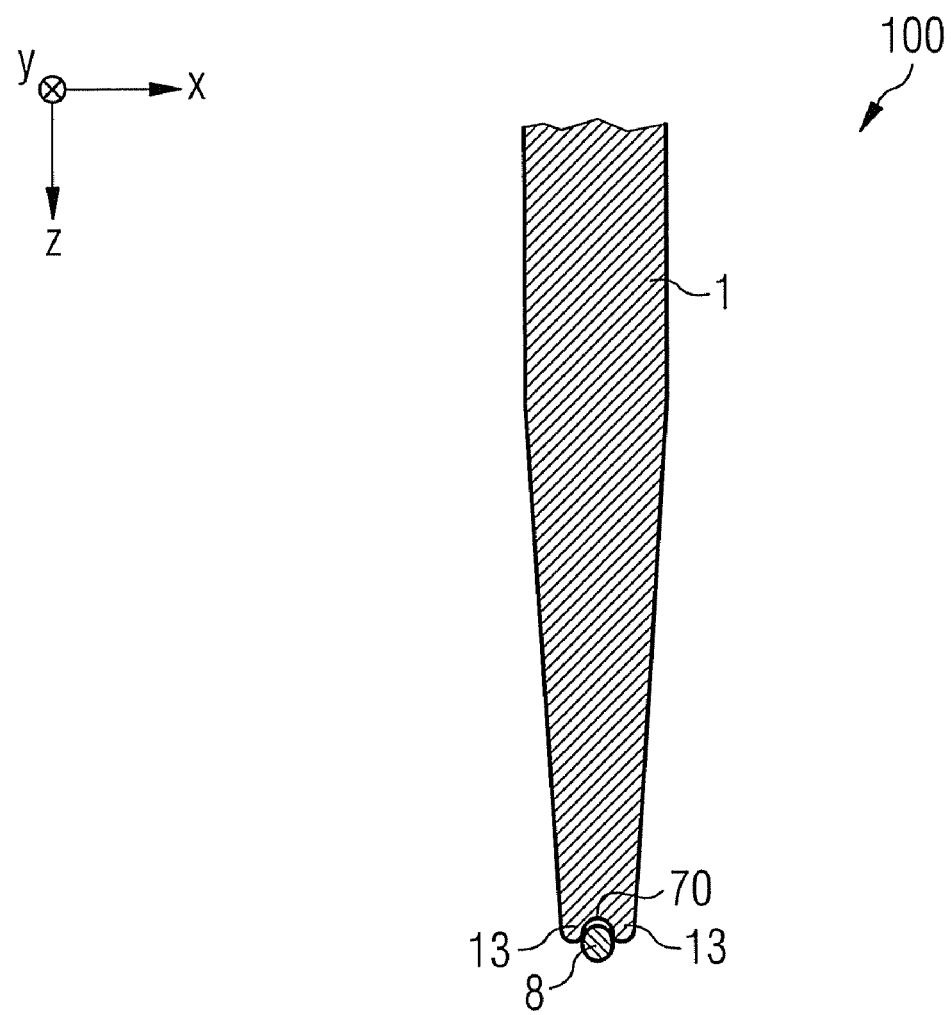
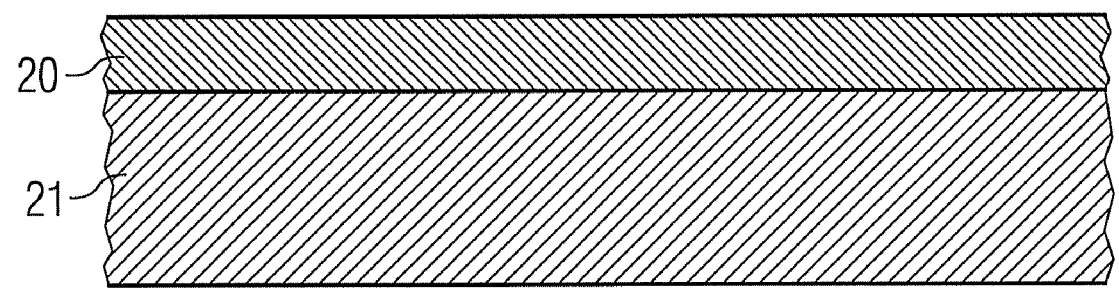

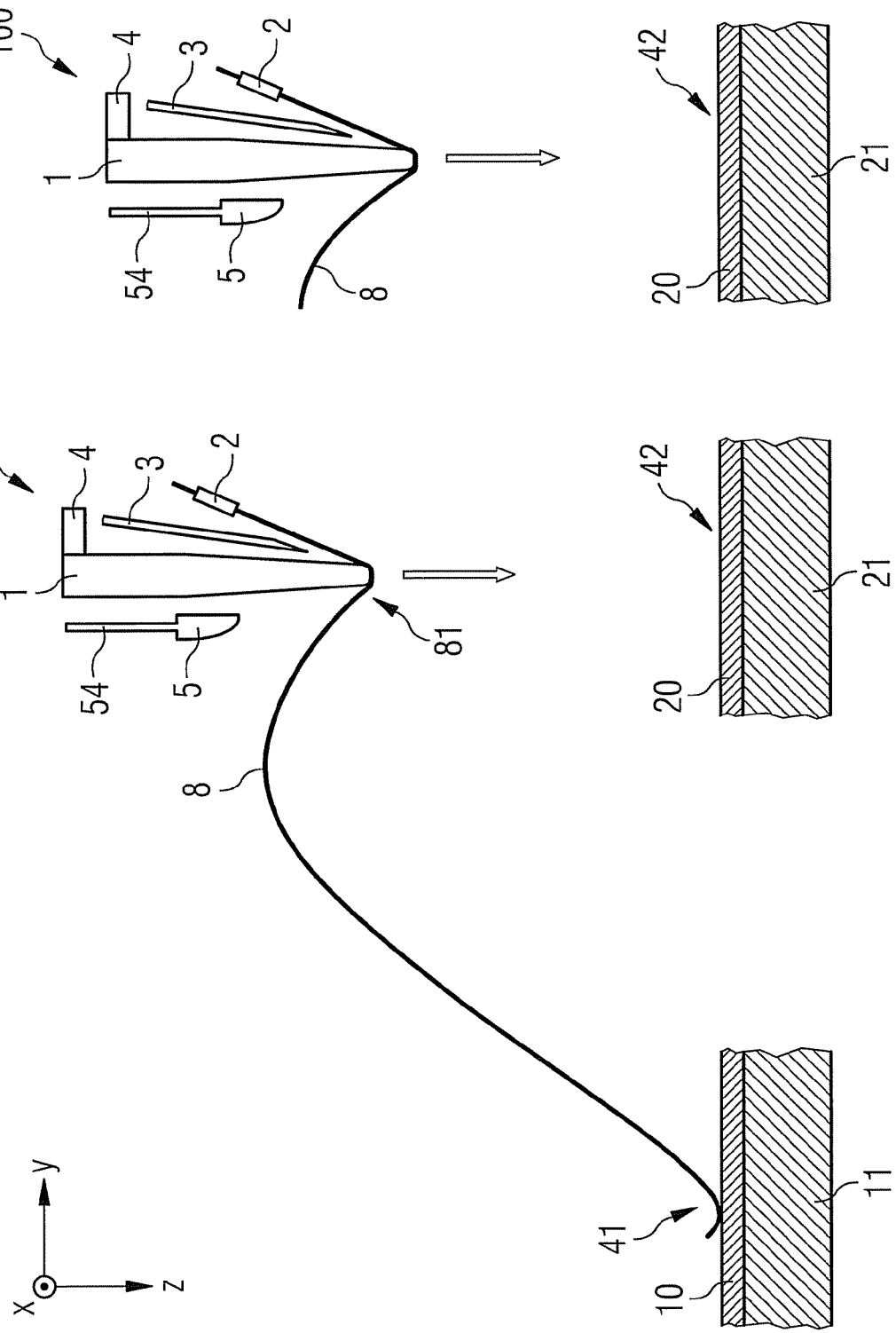

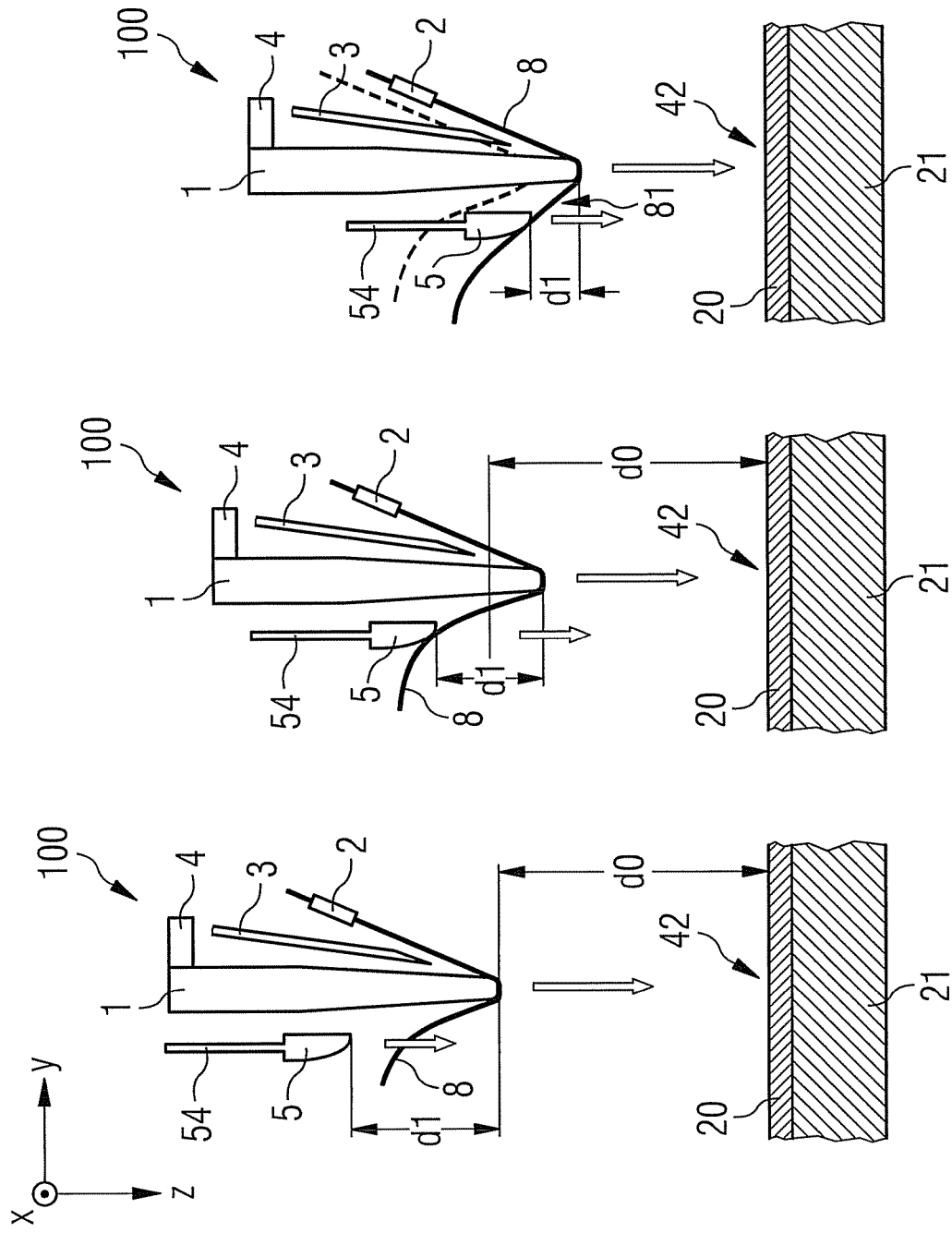

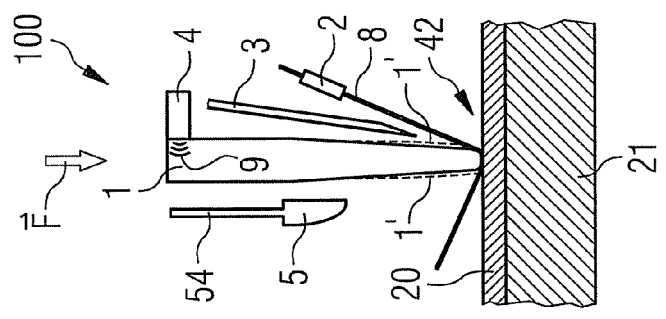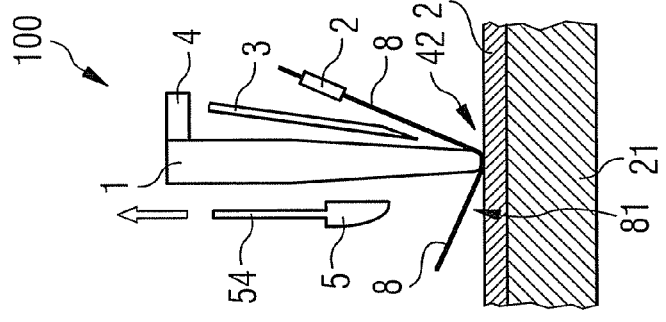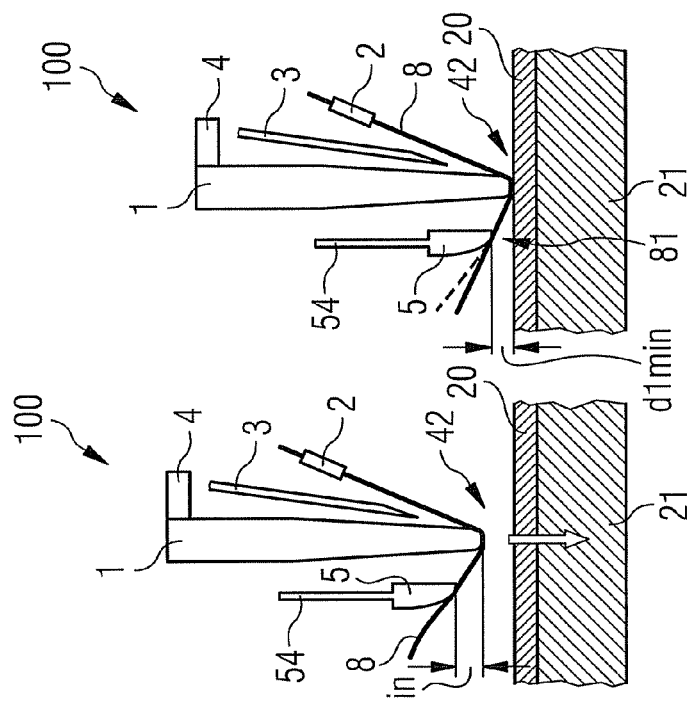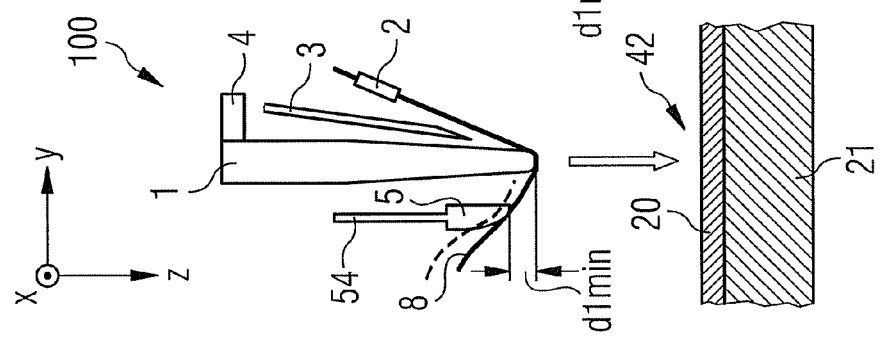

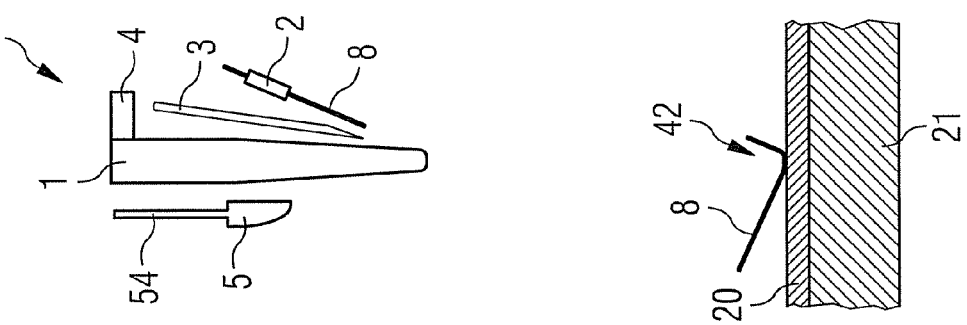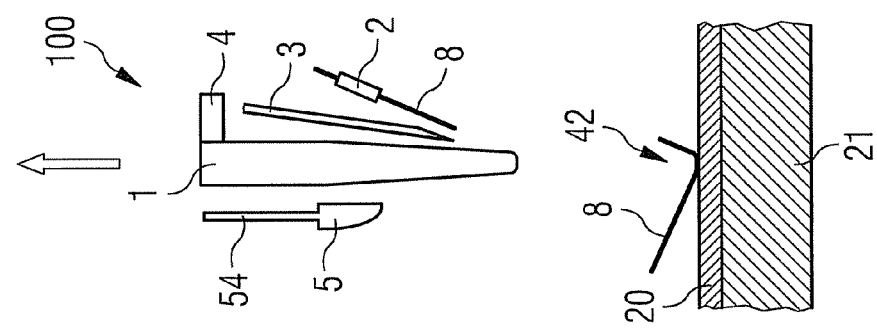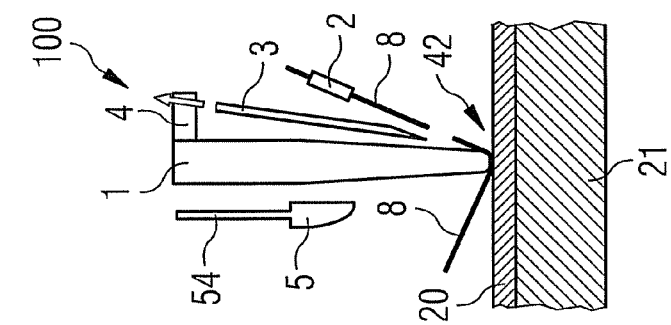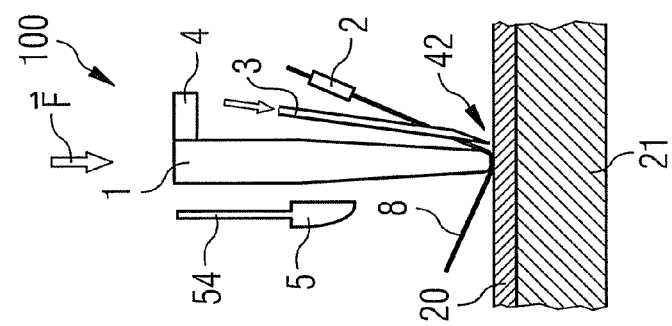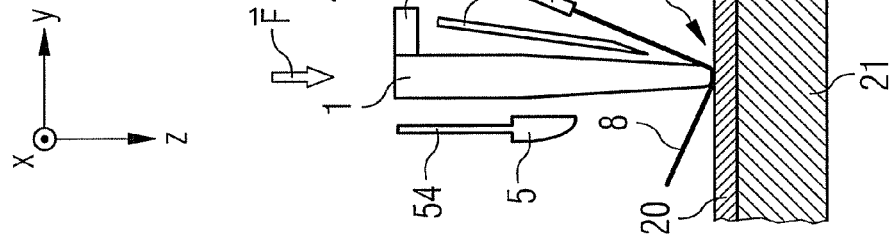

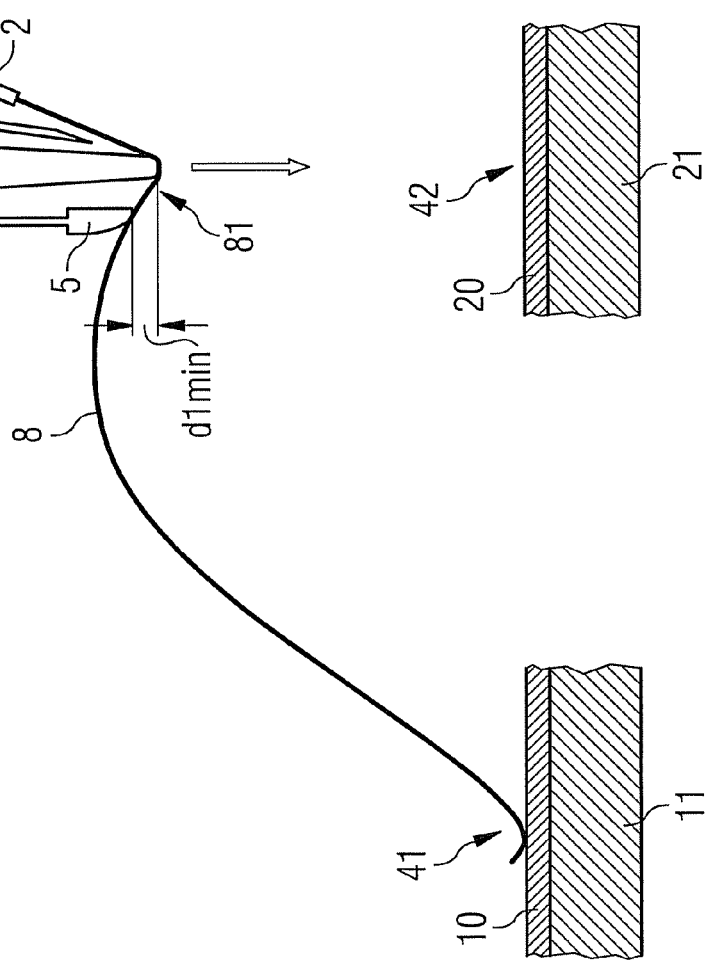
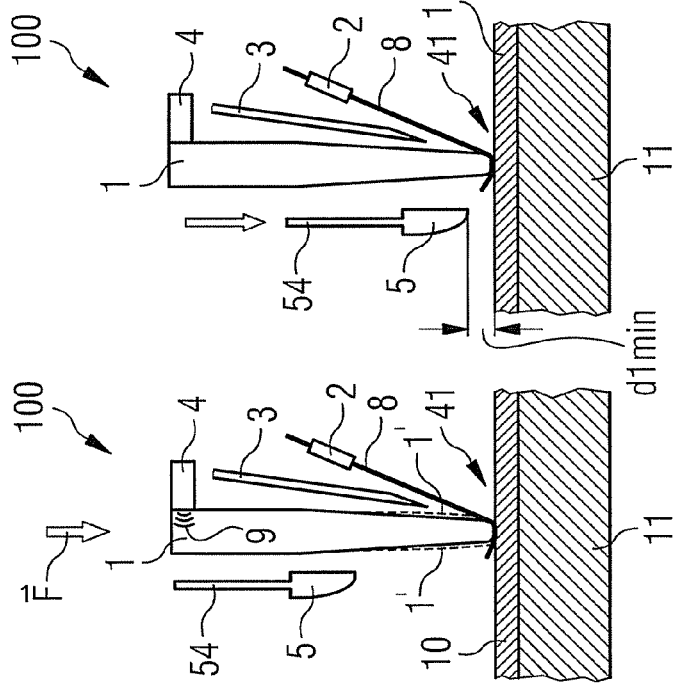
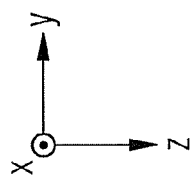

APPARATUS AND METHOD FOR PRODUCING A BONDING CONNECTION

BACKGROUND

One aspect relates to a bonding apparatus and a method for producing a bonding connection.

Bonding connections are used in many areas of electronics for the production of electrically conductive connections. In order for example to electrically conductively connect a first element to a second element by means of a bonding wire, the bonding wire is firstly bonded fixedly to the first element. Proceeding from a first bonding location formed in the process, the bonding wire is guided together with the bonding apparatus into a position above the second element, lowered in the direction of the second element and bonded onto the latter. This results in the formation of a loop between the first bonding location and the second bonding location. The course of said loop depends on the travel of the bonding apparatus and also on the properties of the bonding wire.

If the bonding wire is guided laterally very close to the bonding stamp in the course of the lowering of the bonding stamp toward the second element, then damage to the bonding wire in the heel region can occur during the bonding operation, for example, if the lower end of the bonding stamp oscillates to and fro in the lateral direction during the ultrasonic bonding. In this case, heel region should be understood to mean that section of the bonding wire portion connecting the first bonding location and the second bonding location which directly adjoins the second bonding location. There is, therefore, a need to provide a bonding apparatus with which damage to the heel region can be avoided. Furthermore, there is a need for a method for producing a bonding connection in which damage to the bonding wire in the heel region is avoided.

SUMMARY

One embodiment relates to a bonding apparatus for producing a bonding connection between a bonding wire and a bonding partner. The bonding apparatus includes a bonding stamp, a guide device and a heel shaper. The bonding stamp has a guide area for guiding a bonding wire and can be moved in a vertical direction. The guide device serves for guiding a bonding wire and is arranged laterally alongside the bonding stamp. The heel shaper is arranged on that side of the bonding stamp which is remote from the guide device and has a guide area for guiding a bonding wire.

One embodiment relates to a method for producing a bonding connection. The method involves providing a bonding stamp, a guide device and a heel shaper. The bonding stamp has a guide area for guiding a bonding wire and can be moved in a vertical direction. The guide device serves for guiding a bonding wire and is arranged laterally alongside the bonding stamp. The heel shaper is arranged on that side of the bonding stamp which is remote from the guide device and likewise has a guide area for guiding a bonding wire, is situated relative to the bonding stamp in a first active position or can be moved into a defined first active position.

A bonding wire is inserted into a bonding apparatus, such that the bonding wire is guided along the guide device and along the guide area of the bonding stamp. Moreover, a first bonding partner onto which the bonding wire is to be bonded is provided.

Furthermore, a predetermined first bonding location to which the bonding wire is to be bonded onto the first bonding partner is defined on the first bonding partner. The bonding stamp is then lowered together with the bonding wire inserted into the bonding apparatus in the direction of the predetermined first bonding location until the bonding wire touches the first bonding partner at the predetermined first bonding location. The bonding wire is then bonded to the first bonding partner at the predetermined first bonding location.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

FIG. 3 illustrates a vertical section through the arrangement in accordance with FIGS. 1 and 2 in a sectional plane E1 running through the heel shaper.

FIG. 4 illustrates a vertical section through the arrangement in accordance with FIGS. 1 and 2 in a sectional plane E2 running through the bonding stamp.

FIG. 5 illustrates various steps of a method for producing a bonding connection using a bonding apparatus having a heel shaper on the basis of the example of the bonding apparatus elucidated with reference to FIGS. 1 to 4.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Figure 1:
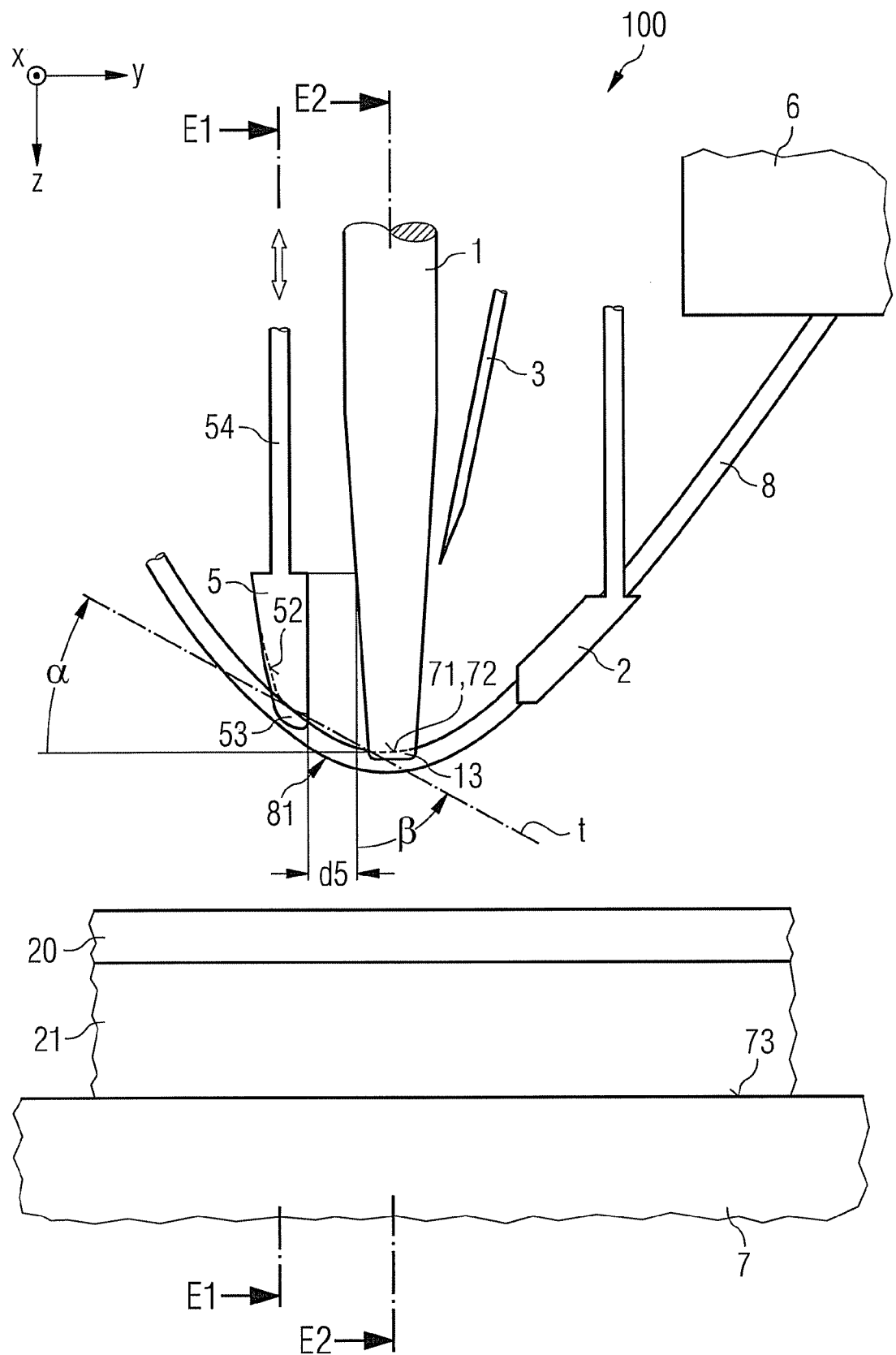
FIG. 1 illustrates a side view of a bonding apparatus according to one embodiment with a heel shaper arranged laterally alongside the bonding stamp opposite a guide device of the bonding apparatus.

FIG. 1 illustrates a side view of a bonding apparatus 100 according to one embodiment, into which apparatus is inserted a bonding wire 8 that is intended to be bonded onto a metallization 20 of a substrate 21. The bonding apparatus 100 includes a bonding stamp 1, a bonding wire reservoir 6, a bonding wire guide 2, a cutting apparatus 3 and a heel shaper 5, and also an optional carrier 7. The optional carrier 7 includes a planar or substantially planar surface section 73 on which one or a plurality of bonding partners can be fixed. By way of example, an electronic module can be fixed on to the surface section 73, which module can contain metallized semiconductor chips, metallized substrates, metallic connection lugs or the like which are to be electrically conductively connected by bonding connections.

The heel shaper 5 is arranged on that side of the bonding stamp 1 which is remote from the wire guide 2, and is spaced apart from said bonding stamp. The heel shaper 5 may be connected to the further components of the bonding apparatus 100 for example by means of a fixing element 54. A bonding wire 8 is inserted into the bonding wire reservoir 6, said bonding wire, in the same way as the substrate 21 and the metallization 20, not being part of the bonding apparatus 100. Proceeding from the bonding wire reservoir 6, which is arranged on the same side of the bonding stamp 1 as the bonding wire guide 2, the bonding wire 8 runs along or through the bonding wire guide 2 under the bonding stamp 1 through to the heel shaper 5 and is tangent to the latter at least one location.

For guiding the bonding wire 8, the bonding stamp 1 and the heel shaper 5 have guide areas 72 and 52, respectively, which are illustrated in each case by dashed lines. In the region of the guide area 52, the heel shaper 5 may be formed cross-sectionally in the shape of a circle segment or in wedge-shaped fashion. In order also to achieve a lateral guidance of the bonding wire 8, the bonding stamp 1 and/or the heel shaper 5 may in each case optionally have in each case at least two guide cheeks 13 and 53, respectively, which are spaced apart from one another in a lateral direction x perpendicular to a vertical direction z and to a lateral direction y and thereby form a guide groove for the bonding wire. The vertical direction z may for example run parallel to a normal to the planar surface section 73. In addition, the vertical direction z and the lateral direction y may likewise run perpendicular to one another. The bonding stamp 1 and/or the bonding apparatus 100 may be moved toward the carrier 7 in the vertical direction z and away from the carrier 7 counter to the vertical direction z.

Optionally, the heel shaper 5 may be moved in the vertical direction z relative to the bonding stamp 1, which is indicated by a black filled-in double-headed arrow. If a common tangent t is placed against the guide areas 52 and 72, then said tangent t forms an angle α with a lateral direction y perpendicular to the vertical direction z, and an angle β with the vertical direction z. The course of the bonding wire 8 in the subsequent heel region 81 can be significantly influenced by the capability of setting the angle α and, in association with this, the capability of setting the angle β. By way of example, if in FIG. 1 the heel shaper 5 is moved toward the metallization 20 in the vertical direction z, then the angle α decreases, while the angle β increases. The bonding wire 8 runs in association with this in the subsequent heel region 81, that is, a section of the bonding wire 8 which is adjacent to the bonding location produced at the bonding connection after the production thereof on that side of the bonding stamp which faces the heel shaper, and extends at least as far as the heel shaper 5. The smaller the angle α is chosen to be, the lower the probability of the heel region being damaged during a later ultrasonic bonding by a lower section of the bonding stamp 1 that oscillates to and fro in the lateral direction y, for example by an outer edge of the guide element 71 and/or by an outer edge of the guide element 72. A heel shaper 5 that is immobile relative to the bonding stamp 1 can be arranged for example in such a way that the angle α, which specifies the angle between the tangent t and a section of the bonding partner—here the metallization 20—which runs substantially perpendicular to the vertical direction z at the bonding location 42 provided, lies in a range of 0° to 60°. In the case of a heel shaper 5 that is movable relative to the bonding stamp 1, the angle α may be able to be set for example in a range of 0° to 60°.

In order, furthermore, to prevent the heel shaper 5 from touching the bonding stamp 1, the distance d5 between the heel shaper 5 and the bonding stamp 1 in the lateral direction y may be chosen to be greater than a predetermined value, for example 100 μm, or for example in a range of 5 μm to 3000 μm. Moreover, the heel shaper 5 and/or the fixing element 54 can be acoustically decoupled from the remaining elements of the bonding apparatus 100 by a suitable decoupling means in order to prevent or at least reduce a transmission of oscillations to the heel shaper 5. This may be done by means of a buffer, for example a hard rubber support, which is fixed to the fixing element 54 or the heel shaper 52 in such a way that the distance d5 is determined by way of the thickness of said buffer.

Figure 2:
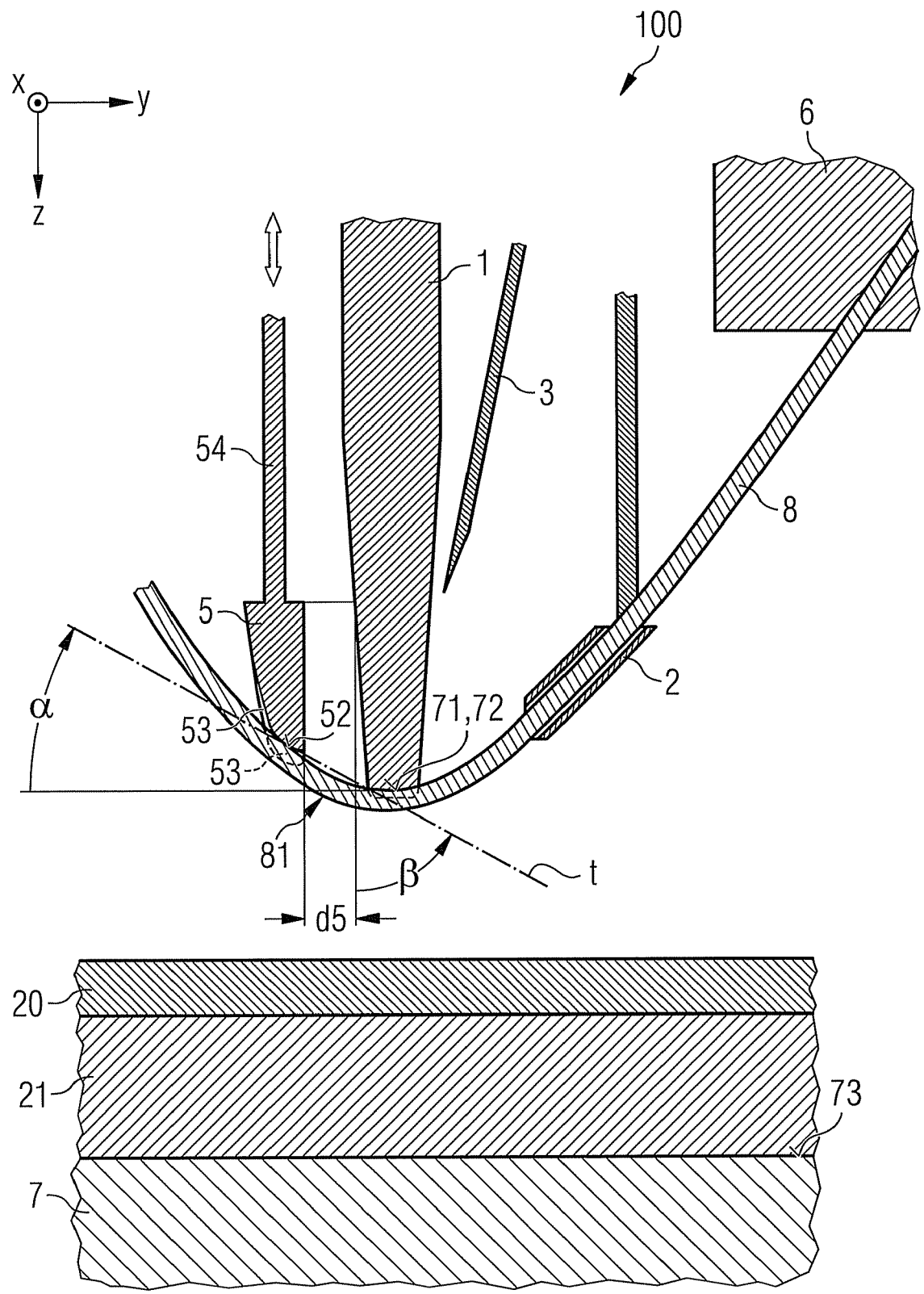
FIG. 2 illustrates a vertical section through the arrangement in accordance with FIG. 1 in a sectional plane parallel to the illustration plane with FIG. 1.

FIG. 2 illustrates a vertical section through the bonding apparatus 100, the bonding wire 8 and the substrate 21 with its metallization 20 in a sectional plane which is perpendicular to the lateral direction x and which runs through the guide grooves of the bonding stamp 1 and of the heel shaper 5. This view makes it clear that the bonding wire 8 runs at least along sections of the guide areas 72 and 52.

A section through the sectional plane E1 which is perpendicular to the lateral direction y and which can be seen from FIGS. 1 and 2 is illustrated in FIG. 3. The sectional plane E1 runs through the heel shaper 5 and the fixing element 54. The guide groove 50 of the heel shaper 5 can be discerned in this view, said guide groove being formed inter alia by two guide cheeks 53 which are spaced apart from one another in the lateral direction x and between which runs the bonding wire 8. Correspondingly, the bonding stamp 1 likewise has a guide groove formed by two guide cheeks 13 of the bonding stamp 1 which are spaced apart from one another in the lateral direction x. In its upper region, the bonding wire 8 runs between said guide cheeks 13 of the bonding stamp 1, while on its underside it projects beyond the bonding stamp 1 and thus also the guide cheeks 13 thereof in the direction of the metallization 20. The distance between the guide cheeks 53 is chosen such that the movement of the bonding wire 8 along the guide groove 50 cannot be impeded or even stopped by them, that is, that there is a sufficient play between the guide cheeks 53 and a bonding wire 8 inserted into the guide groove 70. The guide groove may be formed in concave fashion as seen from below and may have for example a v-shaped or u-shaped cross section.

A vertical section in a sectional plane E2—which is perpendicular to the lateral direction y and which can be seen from FIGS. 1 and 2—through the bonding stamp 1, the bonding wire 8 and also the substrate 21 and the metallization 20 thereof is illustrated in FIG. 4. This view reveals the guide groove 70 of the bonding stamp 1, which is formed in one example by two guide cheeks 13 of the bonding stamp 1 which are spaced apart from one another in the lateral direction x. In accordance with the present exemplary embodiment, the guide groove 70 has a v-shaped cross section. In principle, however, the guide groove 70 may also have any other, for example u-shaped, cross sections.

Various significant steps of a first method for producing a bonding connection by means of a bonding apparatus 100 having a heel shaper 5 are explained below with reference to FIGS. 5A to 5P. In this case, the bonding apparatus 100 may be formed in accordance with the bonding apparatus 100 elucidated in FIGS. 1 to 4. In one embodiment, the guide device 2, the cutting apparatus 3, the ultrasonic generator 4 and the fixing element 54 are only illustrated schematically. The bonding wire reservoir 6 required for providing the bonding wire 8 is not illustrated. The bonding stamp 1, the guide device 2, the cutting apparatus 3, the ultrasonic generator 4, the heel shaper 5 and the fixing element 54 are connected to one another, wherein the cutting apparatus 3 and optionally also the heel shaper and the fixing element 54 are adjustable at least in the vertical direction z relative to the bonding stamp 1.

FIG. 5A illustrates a first bonding partner 10 and a second bonding partner 20, between which an electrically conductive bonding connection is intended to be produced by means of a bonding wire 8. The first bonding partner 10 and the second bonding partner 20 are formed by way of example as metallizations of substrates 11 and 21, respectively. In principle, however, the bonding partners 10, 20 may also be any other electrically conductive elements, for example metallizations of semiconductor chips, chip carriers, electrical connection lugs of electronic modules or virtually any other electrical or electronic components.

In FIG. 5A, the bonding wire 8 has already been bonded onto the metallization 10 at a first bonding location 41. In order to produce the bonding connection at the first bonding location 41, it was necessary for the bonding stamp 1 to press the bonding wire 8 against the metallization 10 with a specific force. In order to arrive at the arrangement illustrated in FIG. 5A proceeding from this situation, the bonding apparatus 100 was brought firstly away from the metallization 10 in the negative z direction and then in the lateral direction y into a position above the bonding location 42 provided and was then moved in the z direction again toward the bonding location 42 provided. Depending on the relative position of the bonding locations 41 and 42 with respect to one another, it may be necessary in this case also to move the bonding apparatus 100 in the lateral direction x.

The movement along different coordinates x, y or z may be performed, in principle, in any desired manner successively or simultaneously. By way of example, the bonding apparatus 100, proceeding from the first bonding location 41, may be moved firstly an amount only in the negative z direction and then simultaneously both in the negative z direction and in the positive y direction. Afterward, by way of example, while maintaining the movement in the positive y direction, a downward movement of the bonding apparatus 100 may be effected in the positive z direction toward the second bonding location 42 provided.

Proceeding from the arrangement in accordance with FIG. 5A, the bonding apparatus 100 is subsequently lowered in the direction of the bonding location 42 provided until the bonding stamp 1 presses the bonding wire 8 against the metallization 20. In this situation, the bonding wire 8 forms a loop between the first bonding location 41 and the second bonding location 42 provided. The course of the loop may be determined by the travel of the bonding apparatus 100 from the bonding location 41 toward the bonding location 42 provided. The further the bonding apparatus 100 moves here in the negative z direction, the "more pointed" the loop becomes. If the bonding apparatus 100 moves only minimally in the negative z direction on its way from the first bonding location 41 to the second bonding location 42 provided, then a very flat loop is formed. Although steep loops have a higher electrical resistance and a higher inductance than flat loops, they can nonetheless compensate better for thermomechanical stresses.

Such a steep loop is produced in the arrangement in accordance with FIG. 5A, but this has the effect that the bonding wire 8 runs, in its subsequent heel region 81, at a very acute angle with respect to the bonding stamp 1 and thus very near the latter. This gives rise to the risk of the bonding wire 8 being damaged during the later bonding operation in the heel region 81. In order to avoid such damage, the heel shaper 5 is provided, which is fixed to the other components of the bonding apparatus 100 by means of an optional fixing device 54. Proceeding from FIG. 5A, the entire bonding apparatus 100 together with the bonding wire 8 inserted into it is moved at least in the vertical direction z toward the provided bonding location 42 of the metallization 20, which is illustrated in FIG. 5B. When the underside of the bonding stamp 1 has reached a predetermined height d0 above the bonding location 42 provided in the course of the lowering of the bonding apparatus 100, the heel shaper 5 is moved downward in the vertical direction relative to the bonding stamp 1 in the direction of the bonding location 42 provided, such that the distance d1 between the underside of the heel shaper 5 and the underside of the bonding stamp 1 continuously decreases, which is illustrated in FIG. 5C to FIG. 5E. The distance d0 can be chosen to be identical to, but also greater or less than, a so-called search height of the bonding stamp 1 above the bonding location provided, upon reaching which the speed at which the bonding stamp 1 is moved toward the bonding location 42 provided is reduced in order to avoid mutual damage to the bonding stamp 1, the heel shaper 5 and the bonding partners, here the metallization 20. The distance d0 may be for example 100 µm to 3000 µm, and the search height may be for example 200 µm to 1000 µm. In this case, d0 may optionally be chosen such that the bonding wire 8 is already fixed on the metallization 20 by the bonding stamp 1 before the bonding apparatus 100 reaches the predetermined height d0 in the course of lowering. Otherwise there is the risk of the bonding wire 8 being pushed out from the guide structure formed by the guide elements 71, 72 in the event of contact by the heel shaper 5.

During the lowering of the heel shaper 5, at some time contact occurs between the guide area of the heel shaper 5 and the bonding wire 8, which is illustrated in FIG. 5D. In the course of the further adjustment of the heel shaper 5 relative to the bonding stamp 1 in the positive z direction, the heel shaper 5 bends the bonding wire 8 away from the bonding stamp 1 on that side of the bonding stamp 1 which faces the heel shaper 5, such that the angle between the vertical direction z and the course of the bonding wire 8 in the subsequent heel region 81 becomes increasingly greater, which is illustrated in FIG. 5E. The previous course of the bonding wire such as can be seen in the step in accordance with FIG. 5D is illustrated by dashed lines.

As soon as the distance d1 between the underside of the heel shaper 5 and the underside of the bonding stamp 1 in accordance with FIG. 5F has reached a predetermined minimum value $d1_{min}$, the heel shaper 5 and the bonding stamp 1, at least in the vertical direction z, are initially not moved relative to one another any longer, that is to say that the bonding apparatus 100 is lowered while maintaining the distance $d1_{min}$ in the positive z direction further toward the bonding location 42 provided (FIG. 5G) until the bonding wire 8 bears on the metallization 20 at the bonding location 42 provided, which is illustrated in FIG. 5H. This step is obviated if the height d0 was chosen such that the bonding wire 8 is already in contact with the metallization 20 upon the height d0 being reached during the lowering of the bonding apparatus 100. The predetermined minimum value $d1_{min}$ may be for example 100 μm to 3000 μm.

The position of the heel shaper 5 relative to the bonding stamp 1 in which the distance d1 between the underside of the heel shaper 5 and the underside of the bonding stamp 1 in the vertical direction z has the predetermined minimum value $d1_{min}$ is also referred to hereinafter as the active position of the heel shaper 5. The active position does not have to be chosen to be identical for all bonding connections to be produced; rather, it may be chosen differently depending on the geometry of the bonding connections to be produced and depending on the required course of the bonding wire between adjacent bonding connections to be produced.

FIG. 5D illustrates the arrangement in the state in which the heel shaper 5 first touches the bonding wire 8 in the course of the lowering of the heel shaper 5. In the arrangement in accordance with FIG. 5G, the bonding apparatus 100 has been lowered further than in FIG. 5F while maintaining the distance $d1_{min}$. In FIG. 5H, the bonding wire 8 bears on the metallization 20 at the bonding location 42 provided.

The course of the bonding wire 8 in the heel region 81 is predetermined by the position of the heel shaper 5 relative to the bonding stamp 1. Since the bonding wire 8 is fixed after placement on the metallization 20 by the bonding stamp 1, the heel shaper 5 may be moved away from the metallization 20 again in the negative z direction and be brought into a higher position, which can be seen from FIG. 5I. Afterward, the bonding wire 8 is pressed against the metallization 20 by the bonding stamp 1 by means of a predetermined press-on force F at the bonding location 42 provided and is bonded onto the metallization 20 with the simultaneous action of ultrasound 9, which is provided by an ultrasonic generator 4 and is coupled into the bonding stamp 1. As can furthermore be seen from FIG. 5J, which illustrates this bonding operation, the lower end of the bonding stamp 1 in this case oscillates to and fro in a region 1' in the lateral direction y on account of the excitation by the ultrasound 9, thereby resulting in the formation of a bonding connection between the bonding wire 8 and the metallization 20.

After the production of the bonding connection, the supply of ultrasound 9 to the bonding stamp 1 is ended while maintaining the press-on force F in accordance with FIG. 5K, for example by turning off the ultrasonic generator 4. Likewise while maintaining the press-on force F, the bonding wire 8 is then severed partly or, as is illustrated in FIG. 5L, completely using the cutting device 3, by lowering of the cutting device 3. In the case of only partial severing of the bonding wire 8, the latter must be completely torn away by withdrawing the bonding apparatus 100. For this purpose, the bonding wire 8 is to be fixed at a suitable location, for example in the guide device 2 or in the wire reservoir (not illustrated). As an alternative to a severing of the bonding wire 8, with the bonding apparatus 100 together with the bonding wire 8 inserted into the latter it is also possible to move to one or more further predetermined bonding locations and to bond the bonding wire 8 onto any desired bonding partner at said further bonding locations in the manner described.

After the complete or partial severing of the bonding wire 8, the cutting apparatus 3 may be brought back again into an upper position, for example into its initial position prior to lowering, which is illustrated in FIG. 5M. Subsequently or at the same time as the raising of the cutting device 3, the entire bonding apparatus 100, in accordance with FIG. 5N, may be moved away from the bonding location 42 in the negative z direction and be brought into an upper position, which is illustrated in FIG. 5P. The bonding apparatus 100 is then ready for producing one or more further bonding connections.

Instead of raising only counter to the vertical direction z, the bonding apparatus 100 may, of course, also additionally be moved in the lateral directions x and/or y in order more rapidly to reach the position of a bonding connection that is subsequently to be produced, and thus to optimize the bonding process.

Figure 6D:
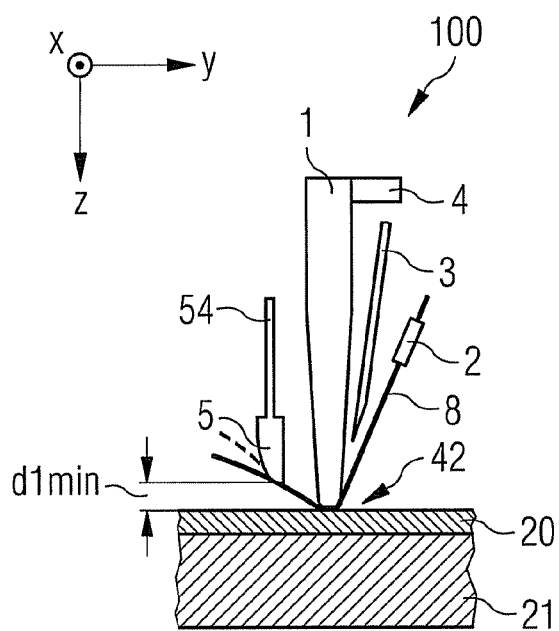
FIG. 6 illustrates various steps in accordance with a modification of the method elucidated with reference to FIG. 5, in which the heel shaping, that is, the course of the bonding wire in the heel region of a bonding connection to be produced, is effected using the heel shaper as early as during the movement of the bonding apparatus from the bonding location of the previously produced bonding connection to the bonding location of the next bonding connection to be produced.

A further variant of a method for producing a bonding connection is explained with reference to FIGS. 6A to 6E. In this variant, the heel shaper 5 is brought into its active position relative to the bonding stamp 1 as early as after the production of the bonding connection at the preceding bonding location 41. FIG. 6A illustrates the bonding apparatus 100 during the production of the first bonding location 41, in the case of which the bonding wire 8 is pressed onto the metallization 10 by the bonding stamp 1 with a press-on force F and is bonded onto said metallization with simultaneous action of ultrasound 9. Apart from the fact that in FIG. 6A the first bonding location 41 is involved rather than the second bonding location 42, this method step may be identical to the method step as illustrated in FIG. 5J. Before the bonding apparatus 100, proceeding from the arrangement in accordance with FIG. 6A, is moved toward a subsequent bonding location provided, the heel shaper 5, in accordance with FIG. 6B, is brought in the vertical direction z into its active position, which may be identical to the active position as illustrated in FIGS. 5F to 5H.

Afterward, the bonding apparatus 100 is moved to the second bonding location 42 provided while maintaining the distance $d1_{min}$ and while forming a loop of the bonding wire 8. FIG. 6C illustrates the arrangement during the movement of the bonding apparatus 100 in a phase in which the bonding apparatus 100 is situated in the vertical direction z above the bonding location 42 provided and is moved toward the latter. During the entire movement phase of the bonding apparatus 100 from the first bonding location 41 toward the second bonding location 42, the relative position between the heel shaper 5 and the bonding stamp 1 is maintained, such that the loop shaping of the bonding wire 8 in the subsequent heel region 81 is already effected during the lateral movement of the bonding apparatus 100 perpendicular to the vertical direction z. After the bonding apparatus 100 together with the bonding wire 8 inserted therein has been lowered in the vertical direction z to an extent such that the bonding wire 8, as illustrated in FIG. 6D, touches the metallization 20 at the second bonding location 42 provided, the heel shaper 5, as already explained with reference to FIGS. 5I and 5J, may be moved away from the first bonding location 41 in the negative z direction and the bonding wire 8 may be bonded onto the metallization 20.

Figure 7:
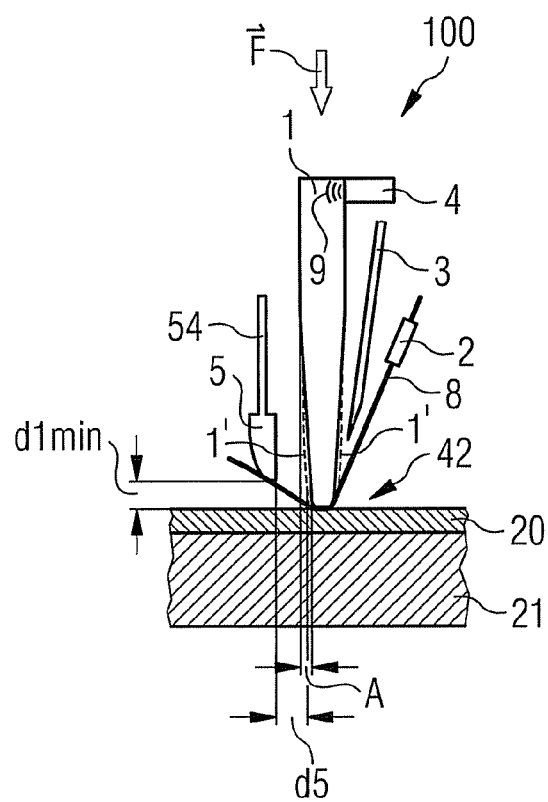
FIG. 7 illustrates a step of a method for producing a bonding connection in which the heel shaper is not moved upward relative to the bonding stamp before the production of the bonding connection.

In accordance with a further variant, illustrated in FIG. 7, the heel shaper 5 may also remain in its active position during the bonding operation, for example, while the ultrasound 9 is coupled into the bonding stamp 1 with simultaneous action of the press-on force F. This means that in the case of this variant it is possible to dispense with lowering the heel shaper 5 relative to the bonding stamp 1, as is illustrated in FIGS. 5C to 5E and also 6B, and with moving the heel shaper 5 upward in the negative z direction, as is illustrated in FIG. 5I. For such a variant of the method it is also possible to use a heel shaper 5 which, during the bonding process, cannot be moved at all or cannot be moved relative to the bonding stamp 1 at least in the vertical direction z. This excludes mounting and/or adjusting settings such as are required before the beginning of the bonding process, for example, when the heel shaper 5 is attached to the bonding apparatus 100.

As is illustrated in FIG. 7, in the case of an ultrasonic bonding in which the heel shaper 5 is in its active position during the introduction of ultrasound 9 into the bonding stamp 1, care must be taken to ensure that the amplitude A of the oscillation which the bonding stamp 1 exhibits under the action of the ultrasound 9 in the lateral direction y, that is to say in the direction toward the heel shaper 5, is smaller than a distance d5 between the heel shaper 5 in the lateral direction y and the bonding stamp 1 in the rest position thereof, that is to say when ultrasound 9 is not coupled into the bonding stamp 1. The distance d5 may be for example 5 μm to 3000 μm.

With the methods explained above, a first, a second and, optionally, any number of further provided bonding locations as desired may be connected to one another. In this case, the production of the first bonding connection, that is, the production of the bonding connection between the first bonding location and the bonding wire, constitutes a special feature since the bonding wire is still not fixed to a bonding partner in this case. Therefore, with the production of the first of two or more bonding connections, the formation of a loop does not occur either. In association with this, there is also no risk of damage to the bonding wire in the heel region, such that the use of the heel shaper may be dispensed with in the production of a first bonding connection. Therefore, a heel shaper which is adjustable in the vertical direction may be moved before the production of the first bonding connection, that is, before the lowering or during the lowering of the bonding apparatus toward the first bonding partner, into a position which is higher relative to the bonding stamp than the active position.

This may be utilized for bonding first bonding partners that are difficult to access, since a heel shaper situated above its active position counter to the vertical direction is less disturbing in the case of bonding partners that are difficult to access, for example in the case of connection lugs which are integrated into the housing frame of a power semiconductor module.

Correspondingly, also before the production of the second or a further bonding connection, the heel shaper may be brought into a position above its active position or remain there if this makes it possible to avoid contact between the heel shaper and an obstacle.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method for producing a bonding connection comprising:
   providing a bonding stamp comprising a guide area for guiding a bonding wire and which may be moved in a vertical direction;
   providing a guide device arranged laterally alongside the bonding stamp for guiding a bonding wire; and
   providing a heel shaper arranged on that side of the bonding stamp which is remote from the guide device and which comprises a guide area for guiding a bonding wire, and which is situated in a first active position relative to the bonding stamp or which may be moved into a defined first active position relative to the bonding stamp;
   inserting a bonding wire such that the bonding wire is guided along the guide device and along the guide area of the bonding stamp;
   defining a predetermined first bonding location on a first bonding partner to which the bonding wire is to be bonded onto the first bonding partner;
   lowering the bonding stamp together with the bonding inserted wire in the direction of the predetermined first bonding location until the bonding wire touches the first bonding partner at the predetermined first bonding location; and
   bonding the bonding wire to the first bonding partner at the predetermined first bonding location.

2. The method of claim 1, wherein the first active position is provided or defined by a predetermined distance between the underside of the heel shaper and the underside of the bonding stamp in the vertical direction.

3. The method of claim 2, wherein the predetermined distance is 100 μm to 3000 μm.

4. The method of claim 1, wherein the first active position is given or defined by a predetermined angle between 0° to 60°, which a common tangent to the guide area of the heel shaper and to the guide area of the bonding stamp forms with the vertical direction.

5. The method of claim 1, wherein the heel shaper is lowered in the vertical direction relative to the bonding stamp right into its first active position after the process of lowering the bonding stamp until the bonding wire touches the first bonding partner.

6. The method of claim 1, wherein the heel shaper is lowered in the vertical direction relative to the bonding stamp right into its first active position before the process of lowering the bonding stamp until the bonding wire touches the first bonding partner.

7. The method of claim 1, wherein the heel shaper is lowered in the vertical direction relative to the bonding stamp right into its first active position during the process of lowering the bonding stamp until the bonding wire touches the first bonding partner.

8. The method of claim 1 further comprising:
   providing a second bonding partner onto which the bonding wire is to be bonded;
   defining a predetermined second bonding location on the second bonding partner to which the bonding wire is to be bonded onto the second bonding partner;
   defining a second active position of the heel shaper relative to the bonding stamp;
   transferring the bonding stamp by raising the bonding stamp together with the bonding wire inserted, by subsequently positioning and by lowering the bonding stamp in the direction of the predetermined second bonding location until the bonding wire touches the second bonding partner at the predetermined second bonding location; and
   bonding the bonding wire to the second bonding partner at the predetermined second bonding location.

9. The method of claim 8, wherein the heel shaper remains in its active position before and during the transfer of the bonding stamp and wherein the heel shaper is fixed in its active position in an invariable manner relative to the bonding stamp.

10. The method of claim 8, wherein the heel shaper is moved counter to the vertical direction relative to the bonding stamp before or during the transfer of the bonding stamp.

11. The method of claim 8, wherein the heel shaper is moved into the second active position in the vertical direction relative to the bonding stamp during the transfer of the bonding stamp.

12. The method of claim 1, wherein the bonding of the bonding wire to the first bonding partner is effected with involvement of ultrasound coupled into the bonding stamp, wherein the heel shaper remains in the first active position during the bonding with involvement of ultrasound.

* * * * *